United States Patent [19]

Akram et al.

[11] Patent Number: 5,674,785
[45] Date of Patent: Oct. 7, 1997

[54] METHOD OF PRODUCING A SINGLE PIECE PACKAGE FOR SEMICONDUCTOR DIE

[75] Inventors: Salman Akram; Alan G. Wood, both of Boise; Warren M. Farnworth, Nampa, all of Id.

[73] Assignee: Micron Technology, Inc., Boise, Id.

[21] Appl. No.: 563,191

[22] Filed: Nov. 27, 1995

[51] Int. Cl.$^6$ ............................................. H01L 21/60
[52] U.S. Cl. ..................... 437/217; 437/215; 437/209; 437/915
[58] Field of Search ...................... 437/209, 215, 437/217, 915

[56] References Cited

U.S. PATENT DOCUMENTS

| | | |
|---|---|---|
| 4,199,777 | 4/1980 | Maruyama et al. |
| 4,483,067 | 11/1984 | Parmentier ............................. 437/209 |
| 4,505,799 | 3/1985 | Baxter . |
| 4,899,107 | 2/1990 | Corbett et al. . |
| 4,954,458 | 9/1990 | Reid .................................... 437/915 |
| 4,992,849 | 2/1991 | Corbett et al. ........................... 357/72 |
| 4,992,850 | 2/1991 | Corbett et al. ........................... 357/72 |
| 5,022,580 | 6/1991 | Pedder .................................. 437/209 |
| 5,041,396 | 8/1991 | Valero .................................. 437/209 |
| 5,063,177 | 11/1991 | Geller et al. ........................... 437/215 |
| 5,068,205 | 11/1991 | Baxter et al. ........................... 437/215 |
| 5,075,253 | 12/1991 | Sliwa et al. ............................ 437/209 |
| 5,138,434 | 8/1992 | Wood et al. ............................ 357/74 |
| 5,155,067 | 10/1992 | Wood et al. ............................ 437/209 |
| 5,188,984 | 2/1993 | Nishiguchi ............................. 437/209 |
| 5,200,363 | 4/1993 | Schmidt ................................ 437/215 |
| 5,239,198 | 8/1993 | Lin ..................................... 257/693 |
| 5,326,428 | 7/1994 | Farnworth et al. ....................... 156/654 |
| 5,346,859 | 9/1994 | Niwayama .............................. 437/215 |
| 5,346,861 | 9/1994 | Khandros et al. ........................ 437/215 |
| 5,419,807 | 5/1995 | Akram et al. ........................... 156/647 |
| 5,426,072 | 6/1995 | Finnila ................................ 437/915 |
| 5,468,999 | 11/1995 | Lin et al. .............................. 257/784 |
| 5,474,957 | 12/1995 | Urushima .............................. 437/215 |
| 5,536,685 | 7/1996 | Burward-Hoy .......................... 437/215 |
| 5,545,291 | 8/1996 | Smith et al. ............................ 437/209 |

*Primary Examiner*—John Niebling
*Assistant Examiner*—Kevin F. Turner
*Attorney, Agent, or Firm*—Stephen A. Gratton

[57] ABSTRACT

A method for packaging a bare semiconductor die using a one piece package body with a pattern of external conductors is provided. The package body includes a die mounting location and an interconnect opening that aligns with the bond pads on the die. Electrical interconnects, such as wire bonds, are formed through the interconnect opening to establish electrical communication between the bond pads on the die and the conductors on the package body. The conductors on the package body can include solder bumps to permit the package to be flip chip mounted to a supporting substrate such as a printed circuit board or to be mounted in a chip-on-board configuration. The package can be fabricated by bulk micro-machining silicon wafers to form the package bodies, attaching the dice to the package bodies, and then singulating the wafer. Alternately the package body can be formed of a FR-4 material. In addition, multiple dice can be attached to a package body to form a multi-chip module.

41 Claims, 5 Drawing Sheets

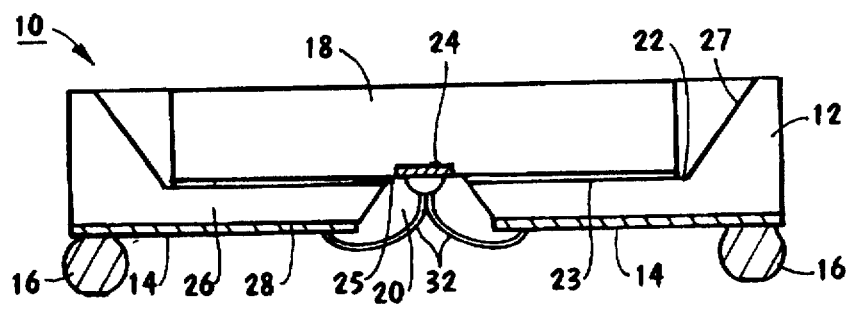
Fig. 1
Fig. 1A
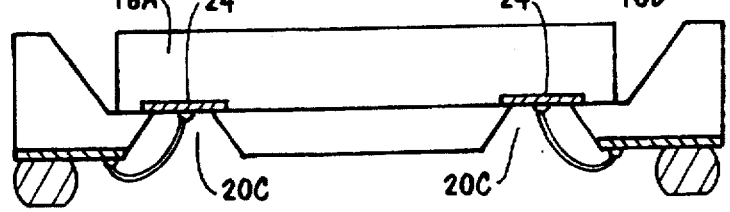
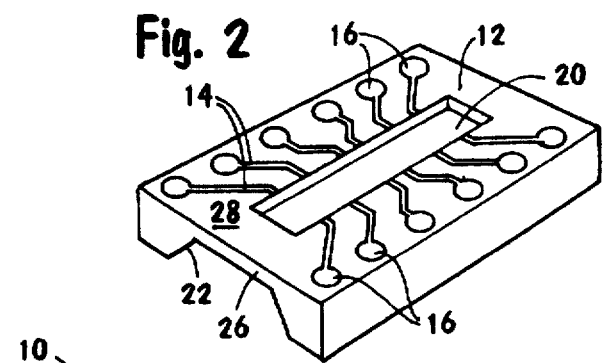
Fig. 2
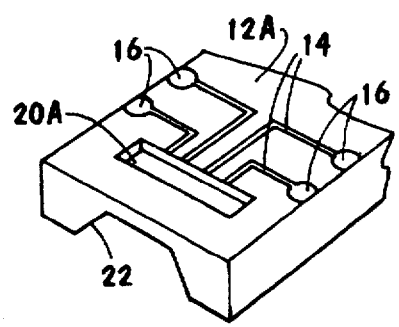
Fig. 2A
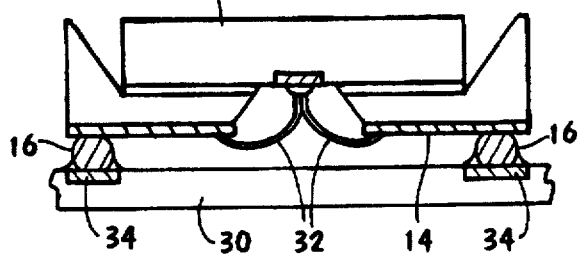
Fig. 3A
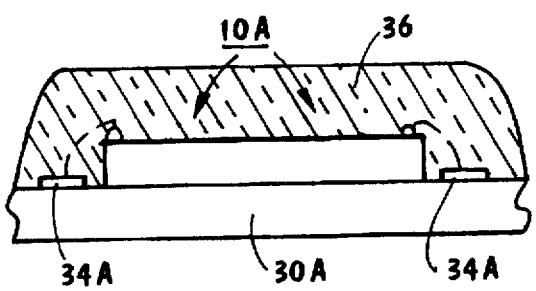
Fig. 3B
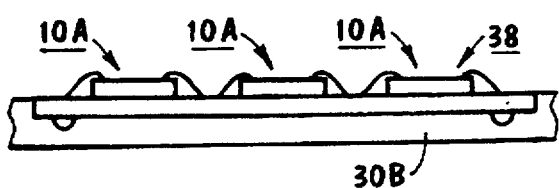
Fig. 3C

METHOD OF PRODUCING A SINGLE PIECE PACKAGE FOR SEMICONDUCTOR DIE

FIELD OF THE INVENTION

This invention relates generally to semiconductor manufacture and specifically to the packaging of semiconductor dice.

BACKGROUND OF THE INVENTION

Semiconductor dice or chips are typically individually packaged for use in plastic or ceramic packages. This is sometimes referred to as the first level of packaging. The package is required to support, protect, and dissipate heat from the die and to provide a lead system for power and signal distribution to the die. The package is also useful for performing burn-in and full functionality testing of the die.

In general, conventional package designs incorporate several common elements. These common elements include a sealed package enclosure, a die attachment area, bond wires for establishing electrical communication with bond pads on the die, and a lead system for the package. Typically the initial component in the packaging process is a leadframe.

The leadframe supports the die during the packaging process and provides the lead system in the completed package. For example in a conventional process for a plastic package, the dice are initially attached to mounting paddles of the leadframe. During a wire bonding process, the bond pads on the face of each die are electrically connected to the lead fingers of the leadframe by wire bonding. The semiconductor dice are then encapsulated in a molded plastic body and a trim and form operation is used to separate the resultant interconnected packages and to bend the leads of each package into a desired configuration (e.g., DIP, ZIP, SOJ).

Semiconductor dice are also used in unpackaged or bare form to construct multi-chip-modules and multi-chip packages. In this case, bare dice are bonded directly to a supporting substrate such as a printed circuit board. The dice can be flip chip mounted to the substrate or wire bonded in a chip-on-board configuration. The dice in a multi-chip-module are sometimes encapsulated in a curable material using an injection molding, pouring or "glob top" process.

Another type of package is disclosed in U.S. Pat. No. 5,239,198 to Lin et al. Here a multi chip package is fabricated using a substrate formed of a printed circuit board material such as FR4. A pattern of conductors is printed on the substrate and each die is wire bonded to the conductors. A molded package body is then formed over the dice and wire bonds. The multi chip package can be electrically mounted on a printed circuit board using solder balls formed on the pattern of conductors.

One problem with each of these conventional packaging processes is that the packages are relatively complex and therefore difficult to manufacture. The present invention is directed to a method for packaging dice that is simpler and cheaper than a conventional packaging process for dice but which provides protection, heat dissipation and a substantial-lead system for a bare die.

Accordingly, it is an object of the present invention to provide an improved method for packaging bare semiconductor dice.

It is yet another object of the present invention to provide an improved package for a single semiconductor die or multiple semiconductor dice.

It is a further object of the present invention to provide an improved semiconductor package that is low cost, that can accommodate different sizes and types of dice, and that can be formed at the wafer level using semiconductor circuit fabrication techniques.

It is a still further object of the present invention to provides an improved single piece package for semiconductor dice that provides efficient thermal conductivity, low stress, and a good thermal match with a bare die.

Other objects, advantages and capabilities of the present invention will become more apparent as the description proceeds.

SUMMARY OF THE INVENTION

In accordance with the present invention, a method for packaging bare semiconductor dice and an improved package for one or multiple semiconductor dice are provided. A package formed in accordance with the invention includes a single piece body having a die mounting location. In addition, the package includes an interconnect opening through the body to the die mounting location. The interconnect opening aligns with bond pads on the die and provides access for electrical interconnection to the die. The package also includes a pattern of conductors formed on an outside surface thereof, which are electrically interconnected to the bond pads on the die. The conductors on the package body terminate in raised solder bumps or wire formed conductors, that provide external mounting and electrical connection points for the package.

In the assembled package, the die is mounted face down on the die mounting location, with the bond pads on the die in alignment with the interconnect opening. Using the interconnect opening for access, the bond pads on the die are interconnected to the pattern of conductors on the package body. A preferred method of electrical interconnection between the die and conductors is wire bonding. However, other interconnect technologies including compressive and non-compressive bonding techniques can also be used. The bonding techniques can include aluminum wedge bonding, TAB bonding or thermal reflow bonding. In addition, the package body can be formed with an interconnect cavity for the electrical interconnection. Furthermore, a curable material can be used to encapsulate the die and the interconnect cavity, or a lid can be used to seal the interconnect cavity.

The package body is preferably formed of silicon but can also be formed of an insulating material such as a resin filled glass fabric (e.g., FR-4). With silicon, a bulk micro machining process of a silicon wafer can be used to form a plurality of package bodies. The dice can then be attached to the silicon bodies which are then singulated from the wafer. The pattern of conductors can be formed using a metallization process (e.g., deposition, patterning, etching) or a screen printing process. The bumps for the conductors can be formed by electrodeposition, screen printing or wire forming processes.

Advantageously the die mounting area and interconnect opening for the package can be made to accommodate different configurations of dice. In addition multiple dice can be mounted in the package to form a multi-chip-module such as an in-line memory module. The assembled package can be flip chip mounted to a supporting substrate such as a printed circuit board (PCB). Alternately, the package can be wire bonded to a supporting substrate in a chip-on-board configuration.

BRIEF DESCRIPTION OF THE DRAWINGS

FIG. 1 is a schematic cross sectional view of a package formed in accordance with the invention;

FIG. 1A is a schematic cross sectional view of a package formed in accordance with the invention;

FIG. 2 is a schematic perspective view of a package body for the package shown in FIG. 1;

FIG. 2A is a schematic perspective view of an alternate embodiment package body;

FIG. 3A is a schematic cross sectional view of a package formed in accordance with the invention and flip chip mounted to a printed circuit board;

FIG. 3B is a schematic side elevation view of a package formed in accordance with the invention and mounted to a printed circuit board in a chip on board configuration;

FIG. 3C is a schematic side elevation view of a multi-chip-module constructed with packages formed in accordance with the invention;

DETAILED DESCRIPTION OF THE PREFERRED EMBODIMENT

Figure 4A:
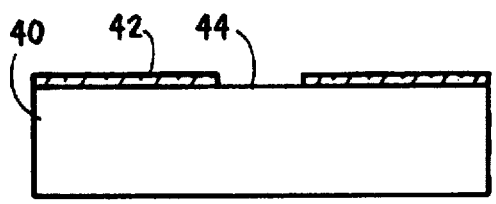
FIGS. 4A–4E are schematic cross sectional views illustrating a process for forming a package in accordance with the invention.

Referring to FIGS. 1 and 2, a package 10 constructed in accordance with the invention is shown. The package 10, generally stated includes: a package body 12; a pattern of insulated conductors 14 formed on an outside surface of the package body 12; and a semiconductor die 18 mounted within the package body 12.

The package body 12 is a monolithic structure that can be formed of monocrystalline silicon. By forming the package body 12 of silicon, a coefficient of thermal expansion (CTE) of the package body 12 will closely match the CTE of the semiconductor die 18. A minimum of stress is thus developed between the package body 12 and the die 18 as a result of temperature cycling. In addition, silicon is a good thermal conductor so that the close proximity of the package body 12 to the die 18 provides efficient heat transfer from the die 18.

The package body 12 includes a die mounting location 22 wherein the die 18 is mounted face down (i.e., circuit side down). In the illustrative embodiment the die mounting location 22 is formed as an etched cavity. However, the die mounting location 22 can be formed with tabs or grooves, or can be a flat surface on the package body 12, or can be a pocket enclosed only on two sides. In the illustrative embodiment, the cavity for the die mounting location 22 is sized to be slightly larger than the die. As shown in FIG. 2, the cavity for the die mounting location 22 can be open ended or it can be a pocket enclosed on four sides (not shown) that matches the peripheral configuration of the die 18. The die 18 is mounted face down to the bottom surface of the die mounting location 22. An adhesive layer 23 formed of an epoxy, acrylic, silicone, polyimide or other dielectric material can be used to secure the die 18 to the die mounting location 22. Alternately the adhesive can be omitted, and the die 18 secured to the die mounting location 22 of the package body 12 with the subsequent interconnection method (e.g., wire bonding, aluminum wedge bonding, TAB bonding or thermal reflow bonding).

In the illustrative embodiment, the die 18 includes a row of bond pads 24 (FIG. 1), which are located along the center portion of the die face 25 (FIG. 1) in the manner of a lead over chip (LOC) die. Typically, a die will include many bond pads (e.g., 10–30). The bond pads 24 on the face 25 of the die 18 align with an elongated interconnect opening 20. The interconnect opening 20 is formed in a lower wall 26 (FIG. 1) of the package body 12 and provides access for establishing electrical communication with the die 18. The interconnect opening 20 is thus sized and shaped to provide access to a row of bond pads 24. One continuous interconnect opening 20 can be formed as shown, or multiple interconnect openings which correspond to fewer than all of the bond pads can be formed. In addition, as shown in FIG. 1A, a package 10D can be formed with interconnect openings 20C that align with a die 18A having bond pads 24 formed along the peripheral sides thereof. Other types of die configurations such as area array pads can also be accommodated by the location and shape of the interconnect openings 20.

One advantage of this construction is that a package body 12 formed as shown in FIG. 1, would accommodate different sizes or types of dice having centrally located bond pads 24. This construction permits a universal or generic package body 12 to be used with different configurations of dice as long as the bond pads 24 on the die align with the interconnect opening. In a similar manner the interconnect openings 20C in FIG. 1A could be made generic to accommodate bond pad configurations for different sizes or types of dice.

Prior to the interconnect procedure (e.g., wire bonding), the bond pads 24 on the die 18 must be aligned with the interconnect opening 20. This can be done using optical alignment and a tool such as an aligner bonder used for flip chip bonding. Such an alignment process is disclosed in U.S. patent application Ser. No. 08/338,345, incorporated herein by reference. Alternately the die mounting location 22 can be formed with etched sidewalls 27 (FIG. 1) that precisely locate the die 18 so that the bond pads 24 on the die 18 align with the interconnect opening 20. A separate alignment fixture or fence can also be used to mechanically align the die 18 with the interconnect opening 20. Such a mechanical alignment fixture is disclosed in U.S. patent Ser. No. 08/452, 990, now U.S. Pat. No. 5,559,444, incorporated herein by reference.

With reference to FIG. 2, the conductors 14 for the package 10 are formed in a desired pattern on a lower external surface 28 of the package body 12. In the illustrative embodiment, the conductors 14 extend from the interconnect opening 20 towards the lateral edges of the package body 12. The number and configuration of the conductors 14 will depend on the number and layout of the bond pads 24 and the circuit requirements for establishing an electrical path to the bond pads 24. As shown in FIG. 2A, the interconnect opening 20A and the pattern of conductors 14, can also be formed to accommodate a die having bond pads on either end, or on either side of the die.

The conductors 14 can be formed on the package body 12 using a semiconductor metallization process, such as deposition (e.g., CVD, sputtering), followed by photopatterning and etching. However, prior to forming the conductors 14 an insulating layer (e.g., 58-FIG. 6) must be formed between the conductors 14 and the package body 12. This insulating layer can be a deposited or grown material such as polyimide, $Si_3N_4$ or an oxide. Exemplary metals for forming the conductors 14 include highly conductive metals such as aluminum and copper. Other suitable metals include titanium, tungsten, tantalum, platinum, molybdenum, cobalt, nickel, gold and iridium. With a metallization process, a representative thickness for the conductors is about 500 Å to about 10 m. Alternately, in place of metallization process for forming the conductors 14 an electroplating or a screen printing process can be used. In addition, an insulating layer (not shown) formed of a dielectric material, such as a nitride (e.g., $Si_3N_4$) or a polyimide, can be deposited over the conductors 14.

A terminal end of each conductor 14 is formed with a raised metal bump 16. The bumps 16 are adapted for flip chip mounting the package 10 to a supporting substrate 30 (FIG. 3A) such as a printed circuit board (PCB). The bumps 16 can be formed by a process such as electrodeposition or screen printing out of solderable alloy such as lead-tin, gold-tin, lead-silver-indium, or a solder wettable paste.

The bumps 16 can also be formed as wire formed conductors. A wire formed conductor is similar to a ball bond used in wire bonding but without the attached wire. Wire formed conductors are formed using a tool similar in construction to a wire bonder. This type of conventional tool can be used to heat a metal wire to a molten state and then press the molten ball against a terminal end of each metal conductor 14. This type of tool is manufactured by Kulicke and Soffa Industries, Inc., Horsham, Pa. and others. Suitable wire for forming the conductors can be obtained from Tanaka Wire and others. Alternately instead of forming the bumps 16 on the package body 12 they can be formed on the supporting substrate (e.g., PCB) to which the package body 12 will ultimately be mounted.

With the die mounted face down within the die mounting location 22, the conductors 14 on the package body 12 are electrically interconnected to the bond pads 24 on the die 18. One method of electrical interconnection is wire bonding. By way of example a conventional wire bonding apparatus can be used to wire bond the conductors 14 to the bond pads 24. During the wire bonding process, thin bond wires 32 are bonded at one end to the bond pads 24 and at the other end to the conductors 14. The bond wires 32 extend through the interconnect opening 20. To facilitate the wire bonding process, the terminal end of the conductors 14, adjacent to the interconnect opening 20, can be formed with a bonding pad of a desired pad metallurgy.

As shown in FIG. 3A, the completed package 10 is adapted for flip chip mounting to a supporting substrate 30 with the bumps 16 in electrical communication with contact locations 34. By way of example, the supporting substrate 30 can be a printed circuit board (PCB) or a ceramic base. With this mounting arrangement, the bumps 16 support the package 10 on the substrate 30 and also establish electrical communication with the contact locations 34 on the supporting substrate 30. Techniques that are known in the art, such as infrared reflow or convection reflow can be used to bond the bumps 16 to the contact locations 34 in electrical communication therewith. With a reflow process a solder paste bonds the bump 16 to the contact locations 34 on the supporting substrate 30. In addition an underfill between the supporting substrate 30 and package 10 can be used if desired.

As shown in FIG. 3B, a chip on board mounting arrangement can also be used to mount a package 10A to a supporting substrate 30A. In this case a wire bond is formed between contact locations 34A on the supporting substrate 30A and the bumps 16 on the package body 12. The bumps 16 (FIG. 1) would not be necessary in this embodiment as the electrical connection could be formed directly to the conductor 14. In addition, in this embodiment a curable encapsulating material 36 can be deposited over the package 10 to seal the assembly. The encapsulating material 36 can by an epoxy, silicone, polyimide or room temperature vulcanizing material. To aid in the encapsulation process, a removable dam (not shown) can be formed on the supporting substrate 30A circumjacent to the package 10.

As shown in FIG. 3C, in another embodiment a multi-chip-module 38 can be formed by mounting a plurality of chip on board packages 10A to a supporting substrate 30B.

For testing the dice 18 (FIG. 1) contained within the package 10, it is preferable to perform testing after the dice 18 have been mounted within the package 10. During the test procedure the package 10 provides support for the dice 18 and permits a robust temporary electrical connection to be made using the bumps 16. However, the dice 18 can also be tested prior to packaging in the manner of a known good die (KGD) or simply probe tested to confirm it is a good die. Furthermore, in the multi chip module 38 shown in FIG. 3C, the dice 18 can be tested individually prior to formation of the module 38, or the module 38 can be tested as a whole after or concurrently with formation thereof.

Referring now to FIGS. 4A–4E, a bulk micro machining process for forming a package body 12B is shown. The bulk micro-machining process is similar to a fabrication process used in semiconductor manufacture to form semiconductor dice. A similar bulk micro-machining process is described in U.S. patent application Ser. No. 08/335,267, now U.S. Pat. No. 5,483,741, incorporated herein by reference.

Although only a single package body 12B is shown in FIGS. 4A–4E for simplicity, it is understood that a large number of package bodies 12B can be formed on a wafer 56 (FIG. 8) of material which is subjected to the micro-machining process. Following micro-machining and attachment of the die to the package body 12B, the wafer 56 is singulated by saw cutting or shearing.

During the micro-machining process and as shown in FIG. 4A, a silicon substrate 40 is provided. A hard mask 42 is formed on the silicon substrate 40. The hard mask 42 can be formed of a material such as silicon nitride ($Si_3N_4$) deposited to a desired thickness (e.g., 500 Å to 3000 Å) using a suitable deposition process (CVD). The hard mask 42 includes openings 44 formed by photopatterning a resist layer and then etching.

Figure 4B:
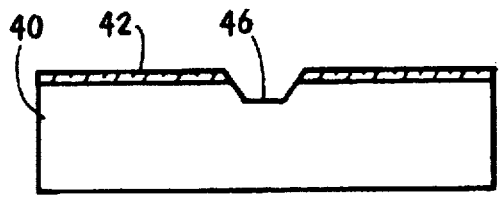
Figure 4C:
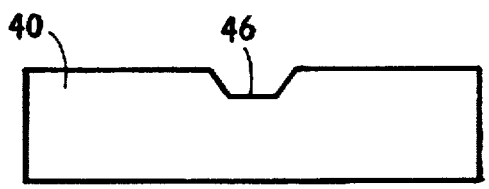

Next, as shown in FIG. 4B, the hard mask 42 is used to anisotropically etch a Groove. 46 into the substrate 40. The groove 46 serves as a pilot for ultimately etching completely through the substrate to form interconnect opening 20B (FIG. 4E). An etchant solution comprising a mixture of KOH and $H_2O$ can be used to etch the pilot groove 46. The anisotropic etch forms the pilot groove 46 with sidewalls that are sloped at an angle of approximately 54° with the horizontal. The slope of the sidewalls is a function of the different etch rates of monocrystalline silicon along the different crystalline orientations. The surface of the substrate 40 represents the (100) planes of the silicon which etches faster than the sloped sidewalls that represent the (111) planes. Etching from the top surface of a silicon substrate produces a slope at a first angular orientation while etching from the bottom surface produces a slope at a second angular orientation. For example, in FIG. 1 the die mounting location 22 can be formed by etching from the top surface of the package body 12 while the interconnect opening 20 can be formed by etching from the bottom surface of the package body 12. Depending on the dimensional requirements these etch steps can be performed consecutively or simultaneously.

Referring back again to FIG. 4C following the etch step, the hard mask 42 is stripped. A nitride hard mask 42 can be stripped using a wet etchant such as $H_3PO_4$ that is selective to the silicon substrate 40.

Figure 4D:
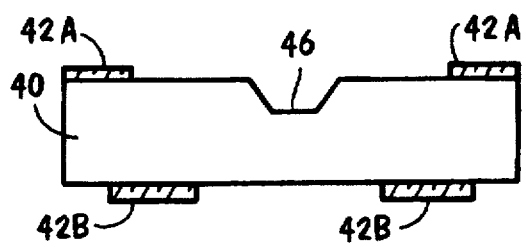
Figure 4E:
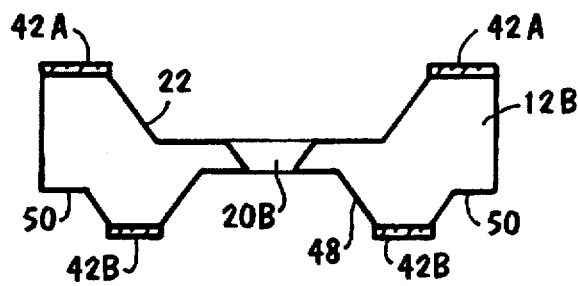
Figure 5:
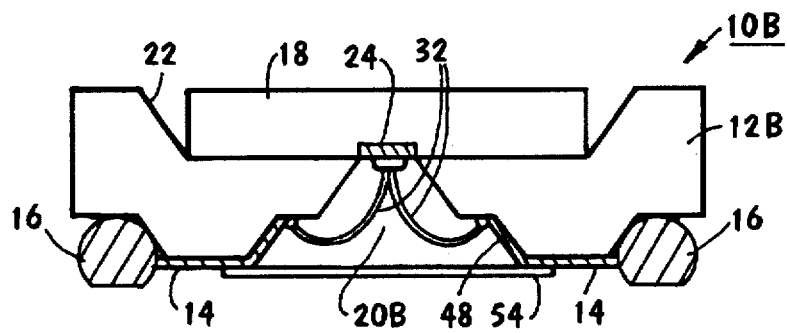
FIG. 5 is a schematic cross sectional view of a package constructed in accordance with the invention with a lid to protect wire bond areas.

Next, as shown in FIG. 4D, a hard mask 42A is formed on an upper surface of the substrate 40 and a hard mask 42B is formed on a lower surface of the substrate 40. Hard mask 42A will be used to form the die mounting location 22 (FIG. 4E) in the substrate 40. Hard mask 42B will be used to form a wire bonding cavity 48 (FIG. 4E) and capture grooves 50 (FIG. 4E) for retaining the bumps 16 (FIG. 5).

Next, as shown in FIG. 4E, another anisotropic etch procedure is performed. As before, this etch can be performed using a mixture of KOH and $H_2O$. Such an etch process performed at 70° C. will remove approximately 25–30 per hour. This forms the die mounting location 22, the interconnect opening 20B, the wire bonding cavity 48 and the capture grooves 50. The depth of the cavity for the die mounting location 22 will be approximately equal to the thickness of the die 18. The depth of the capture grooves 50 will correspond to the size of the bump 16 (FIG. 5). Following the wet etch, the hard masks 42A and 42B are stripped as previously described to complete the package body 12B.

Alternately instead of using multiple etches as shown in FIGS. 4A–4E, the package body can be formed using a single mask and etch step. For example, a single mask and etch step can be used to form the package body 12 shown in FIG. 1. With a single mask and etch step the die mounting location 22 (FIG. 1) can be etched from the top of the package body 12 while the interconnect opening 20 is etched from the bottom of the package body 12. These etch steps can be performed simultaneously using suitable etch masks (not shown) formed on the top and bottom surfaces of the package body 12.

After the package body 12B (or 12) has been formed an oxidation process is used to grow or deposit an oxide layer 58 (FIG. 6) over exposed surfaces of the package body 12B (or 12). Other growth or deposition process can also be employed. For example a low temperature plasma enhanced chemical vapor deposition process (PECVD) can include $O_2$ and a silicon containing species such as silane ($SiH_4$) or TEOS (tetraethylorthosilicate). Other dielectrics such as $Si_3N_4$ can also be deposited to form a blanket insulating layer.

Following formation of the package body 12B the pattern of conductors 14 (FIG. 5) is formed using a metallization or screen printing process. A suitable metallization process will be described subsequently with reference to FIG. 6.

Still referring to FIG. 5, a package 10B formed in accordance with the above process includes conductors 14 and bumps 16 formed as previously described. The die 18 is mounted within the die mounting location 22 of the package 10B substantially as previously described. In the embodiment illustrated in FIG. 5, the wire bonding cavity 48 helps to encompass and protect the bond wires 32 and wire bond areas on the die 18. In addition, a lid 54 can be attached to the package body 12B to cover and seal the wire bonding cavity 48. The lid 54 can be formed of a silicon, metal or plastic material and can be attached using a suitable adhesive. Alternately a glob top of an encapsulant 36B (FIG. 6) can be formed within the wire bonding cavity 48. In the package 10B shown in FIG. 5, the conductors 14 are formed over the surface of the wire bonding cavity 48. In addition, the bumps 16 are situated within the capture grooves 50.

Figure 5A:
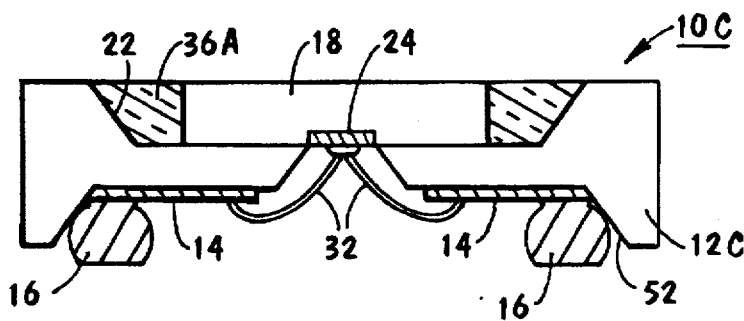
FIG. 5A is a schematic cross sectional view of a package constructed in accordance with the invention with an encapsulant to protect the die and a recess to protect the wire bond areas and conductors.

With reference to FIG. 5A, a package 10C can also be formed with an etched indentation 52 on a lower surface thereof, that encloses the conductors 14, bumps 16 and bond wires 32. Additionally, an encapsulant 36A can be placed within the die mounting location 22 to protect and seal the die 18. The encapsulant 36A can be formed of curable material such as an epoxy, silicone, polyimide or room temperature vulcanizing material as previously described for encapsulant 36 (FIG. 3B). This encapsulant 36A can be applied in the manner of a "glob top" using a dispensing nozzle or can be applied using a spatula tool.

Figure 6:
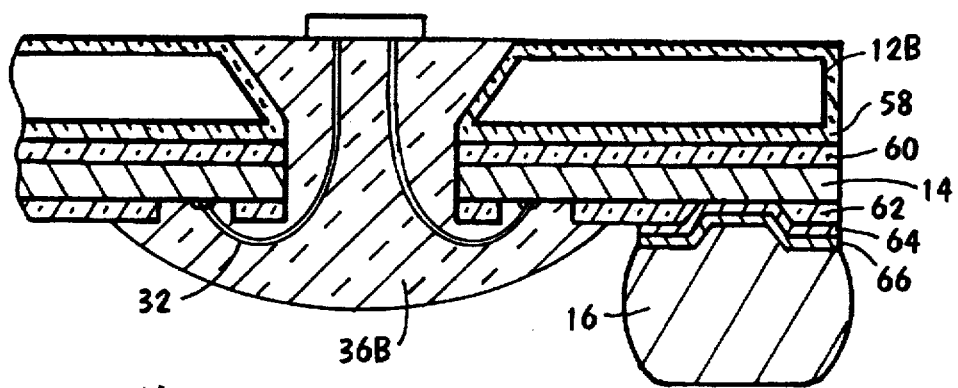
FIG. 6 is a cross sectional view of a portion of a package constructed in accordance with the invention showing a metallization structure for metal conductors on the package.

Referring now to FIG. 6, a metallization structure for forming the conductors 14 is shown. In FIG. 6 the oxide layer 58 has been formed on the surface of the package body 12B. In addition another insulating layer 60 formed of a dielectric such as polyimide is formed on the oxide layer 58 using a suitable deposition process. A conductive layer is then blanket deposited on the insulating layer 60 and patterned to form the desired pattern of conductors 14. Next, an outer insulating layer 62 of a dielectric material such as polyimide is formed over the conductors 14 using a suitable deposition process.

Still referring to FIG. 6, for electrically attaching the bumps 16 to the conductors 14 a barrier layer 64 is formed of a conductive material such as chromium and a seed layer 66 is formed of a material such as copper. Each bump 16 would include a barrier layer 64 formed in a via through the insulating layer 62. The barrier layer 64 and a seed layer 66 can be formed using a suitable metal deposition and patterning process. The bump 16 can be formed of a material such as Sn/Pb using a electrodeposition or screen printing process as previously described.

Figure 7:
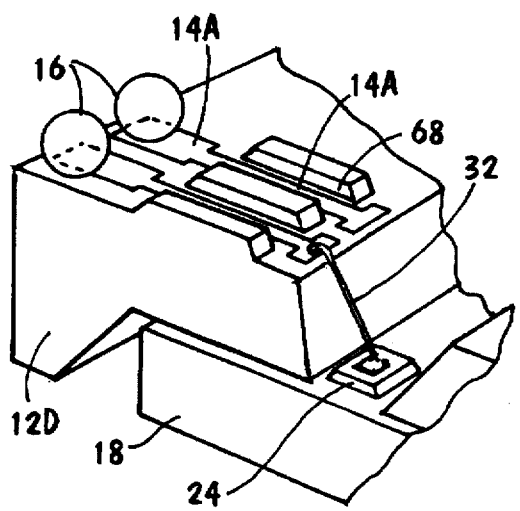
FIG. 7 is a schematic perspective view showing a package constructed in accordance with the invention with grooves for metal conductors on the package.

With reference to FIG. 7, a package body 12D can be formed with etched grooves 68 wherein the conductors 14 are mounted. The etched grooves 68 can be formed during the bulk micro-machining etch processes previously described. The etched grooves 68 could function to protect the conductors 14 and the wires 32 between the die 18 and package body 12D.

Figure 8:
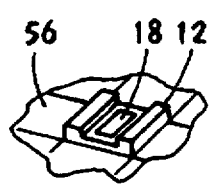
FIG. 8 is a schematic perspective view showing a wafer having etched package bodies constructed in accordance with the invention and semiconductor dice mounted within the package bodies.

With reference to FIG. 8, the wafer 56 with the etched package bodies 12 is shown prior to singulation. In order to facilitate the manufacturing process, the dice 18 can be attached to the package bodies 12 prior to singulation of the wafer. An adhesive as previously described can be used to attach the dice 18 to the package bodies 12. Following formation of the package bodies 12 and attaching of the dice 18 thereto, the wafer 56 can be singulated by saw cutting.

Figure 9:
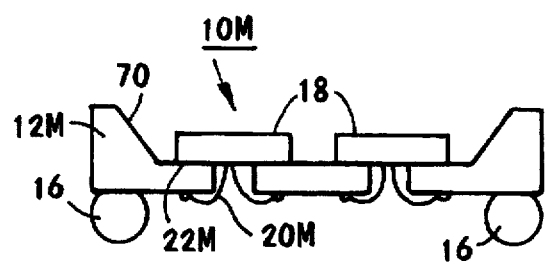
FIG. 9 is a schematic cross sectional view of an alternate embodiment package constructed in accordance with the invention with multiple dice.

With reference to FIG. 9, a package 10M can be formed to accommodate multiple dice 18. In this case the package body 12M can be formed as previously described with a single large cavity 70 having multiple die mounting locations 22M and multiple interconnect openings 20M. In this embodiment the package 10M forms a multi-chip module. The package 10M can also be formed as an in line memory module comprised of one or more dice 18.

Figure 10:
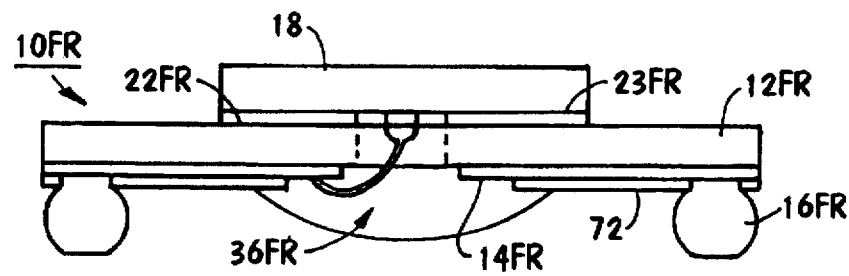
FIG. 10 is a schematic cross sectional view of an alternate embodiment package constructed in accordance with the invention.

With reference to FIG. 10 an alternate embodiment package 10FR is shown. The alternate embodiment package includes a substrate 12FR formed of a FR-4 material. FR-4 is the industry designation for a fire retardant epoxy resin/glass laminate. The substrate 12FR is a flat planar piece of material having a die mounting location 22FR. The die 18 is mounted on the substrate 12FR using an adhesive layer 23FR as previously described. A preferred material for the adhesive layer is silicone which provides a good thermal match with the silicon die 18 and with the FR-4 substrate. In addition an encapsulant 36R for the wire bond areas can be formed of silicone or other suitable curable material. A pattern of conductors 14FR is formed on the surface of the substrate 12FR substantially as previously described. In addition bumps 16FR are formed as previously described on a solder mask 72. The solder mask 72 is formed of a resin as is known in the art.

Figure 12A:
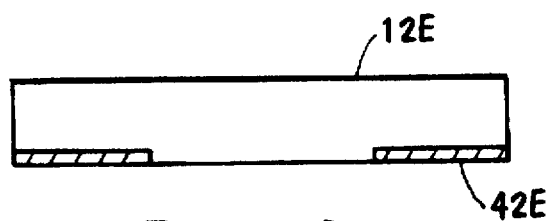
FIGS. 12A–12C are schematic cross sectional views illustrating steps in the formation of another alternate embodiment package.
Figure 12B:
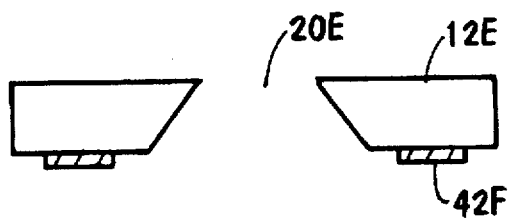
Figure 12C:
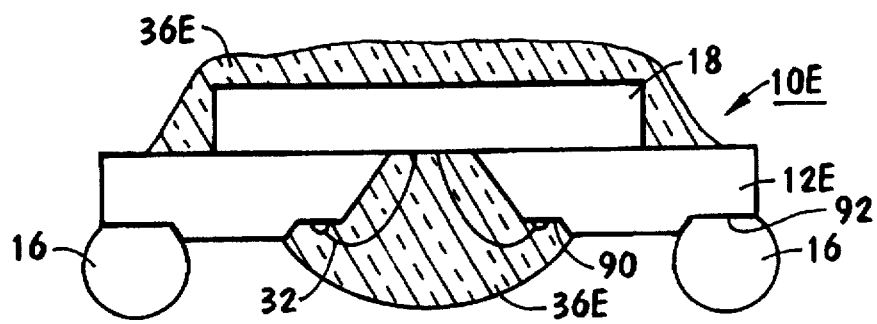

A process for forming a flat package 10E is shown in FIGS. 12A–12C. In this embodiment the package body 12E is formed of silicon and includes an etched interconnect opening 20E (FIG. 12B) formed using a mask 42E (FIG. 12A) as previously described. In addition the package body 12E includes a bond shelf 90 (FIG. 12C) and capture grooves 92 (FIG. 12C) for bumps 16 (FIG. 12C) formed using a mask 42F (FIG. 12B). The die 18 is wire bonded to the conductors (not shown) formed as previously described. An encapsulant 36E as previously described covers the die 18 and the bond wires 32.

Figure 13A:
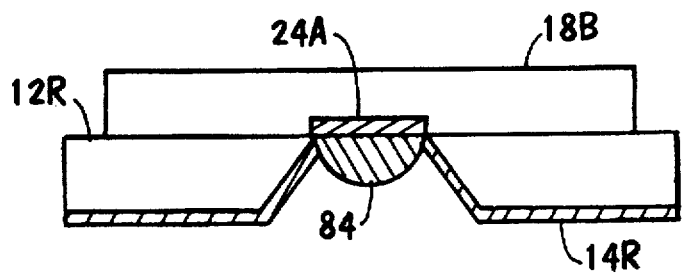
FIGS. 13A–13B are schematic cross sectional views illustrating a thermal reflow bonding method for interconnecting a die and package in accordance with the invention.
Figure 13B:
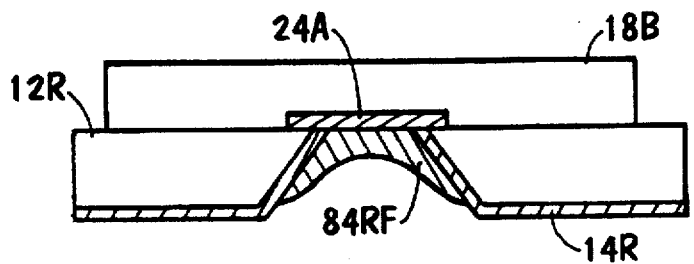

FIGS. 13A and 13B illustrate a reflow process for interconnecting a bumped die 18B with a package body 12R formed in accordance with the invention. In this embodiment a solder bump 84 is formed on the bond pad 24A of the die 18B. The solder bump 84 can be a solderable material such as a hard or soft solder alloy as previously described. The solder bump 84 can be formed using a conventional process such as screen printing, evaporation through a metal mask or out of a wire using a ball bonder apparatus. As shown in FIG. 13B, with the die 18B mounted to the package body 12R face side down, the solder bump 84 is reflowed onto the conductors 14R to form a solder reflow 84RF. In this case the conductors 14R can also be formed of a solder wettable material. The solder reflow 84RF thus electrically interconnects the bond pad 24A on the die 18B and flip chip mounts the die 18B to the package body 12R.

In each of the described embodiments the package (10, 10A, 10B, 10C, 10D, 10E, 10M, 10FR), provides protection and heat dissipation for the die 16. In addition, such a package requires no lead frame yet provides a substantial lead system for attachment to a supporting substrate. Furthermore, manufacture is simpler and less expensive than a conventional packaging process because bulk micro-machining techniques can be used.

Figure 11:
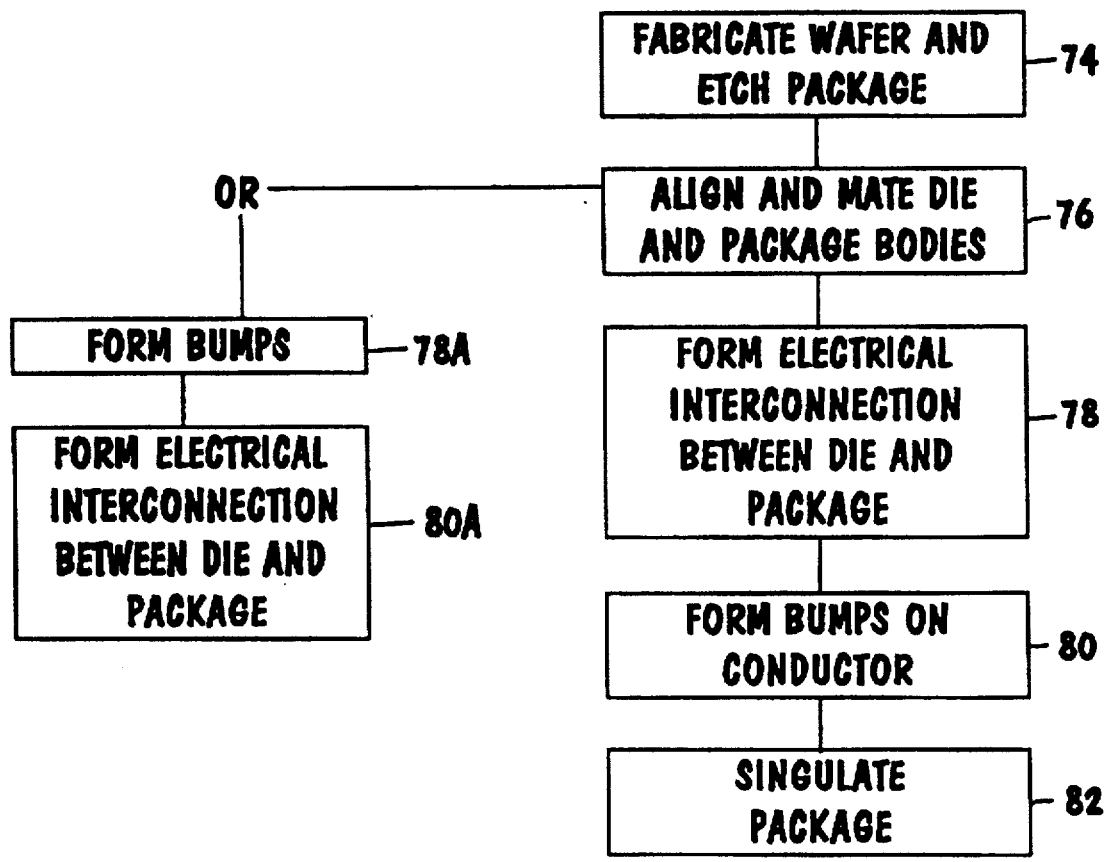
FIG. 11 is a flow diagram of a process for manufacturing packages in accordance with the invention.

With reference to FIG. 11 a flow diagram of a manufacturing process for forming the package 10, 10A, 10B, 10C, 10D or 10M is shown. Initially the wafer 56 (FIG. 8) is formed and the packages 12 are etched (step 74) using micro-machining. Next, the dice 18 and packages 12 are aligned and the dice 18 are mated with the package bodies 12 (step 76). The dice 18 and package bodies 12 can be aligned using an optical alignment procedure as described in previously cited co-pending application Ser. No. 08/338,345 or using a mechanical alignment fixture as described in previously cited co-pending application Ser. No. 08/452, 990, now U.S. Pat. No. 5,559,444.

Next, the electrical interconnection between the bond pads 24 on the dice 18 and conductors 14 on the package bodies 12 is formed (step 78). A preferred method of electrical interconnection is wire bonding although other compressive and non-compressive technologies can be used.

Next the bumps 16 are formed on the conductors 14 as previously described (step 80) and the wafer 56 is singulated (step 82). Alternately the bumps can be formed (step 78A) prior to electrical interconnection of the dice 18 and conductors 14 (step 80A).

While the invention has been described with reference to certain preferred embodiments, as will be apparent to those skilled in the art, certain changes and modifications can be made without departing from the scope of the invention as defined by the following claims.

What is claimed is:

1. A method for packaging a semiconductor die comprising:

forming a package body with a die mounting location;

forming an interconnect opening through the package body, said opening extending from the die mounting location to a surface of the package body;

forming a pattern of grooves on the surface;

forming an insulating layer in the opening and on the surface;

forming pattern of conductors within the grooves;

mounting the die circuit side down on the die mounting location with a pattern of bond pads on the die accessible through the interconnect opening; and forming an electrical interconnection between the pattern of bond pads and the pattern of conductors by wire bonding through the interconnect opening.

2. The method as claimed in claim 1 further comprising forming the package body and interconnect opening in a configuration for packaging the die or for packaging a second die having a different pattern of bond pads.

3. The method as claimed in claim 1 further comprising forming a second interconnect opening through the package body and wire bonding through the second interconnect opening to a second pattern of bond pads on the die.

4. The method as claimed in claim 1 further comprising forming a capture groove in the surface and forming a metal bump on the capture groove in electrical communication with a selected conductor.

5. The method as claimed in claim 1 further comprising forming a wire bonding shelf on the surface for wire bonding to the pattern of conductors.

6. The method as claimed in claim 1 wherein the package body comprises silicon.

7. The method as claimed in claim 1 further comprising forming a pattern of bumps on the pattern of conductors, said bumps configured for flip chip mounting the package to a substrate.

8. The method as claimed in claim 1 further comprising aligning the bond pads on the die with the interconnect opening using optical alignment.

9. The method as claimed in claim 1 further comprising aligning the bond pads on the die with the interconnect opening using an alignment fixture.

10. The method as claimed in claim 1 further comprising flip chip mounting the package body to a supporting substrate with the pattern of conductors in electrical contact with a pattern of contact locations on the supporting substrate.

11. The method as claimed in claim 1 further comprising mounting the package body on a supporting substrate in a chip on board configuration with the pattern of conductors wire bonded to a pattern of contact locations on the supporting substrate.

12. The method as claimed in claim 1 wherein forming the package body comprises etching a die cavity and then etching the interconnect opening.

13. The method as claimed in claim 1 wherein forming the pattern of conductors comprises forming a layer of polyimide on the conductors.

14. The method as claimed in claim 1 wherein forming the pattern of conductors comprises a screen printing process.

15. The method as claimed in claim 1 further comprising encapsulating the die on the die mounting location by depositing and curing a material on the die and package body.

16. The method as claimed in claim 1 further comprising depositing and curing a material over the interconnect opening and a wire bonding area.

17. The method as claimed in claim 1 further comprising mounting the package on a supporting substrate in a chip on board configuration with the pattern of conductors wire bonded to a pattern of contact locations on the supporting substrate and then encapsulating the package using a curable material.

18. A method for packaging a semiconductor die comprising:
providing a substrate;
providing the die with a pattern of bond pads having solder bumps formed thereon;
forming a die mounting location on the substrate to form a package body;
forming an opening from the die mounting location to a surface of the package body;
forming a pattern of grooves on the surface of the package body;
forming a pattern of conductors within the grooves;
aligning the bond pads on the die with the opening in the package body;
placing the die circuit side down on the die mounting location; and
electrically connecting the bond pads on the die to the conductors on the package body by reflowing the solder bumps through the opening onto the conductors.

19. The method as claimed in claim 18 further comprising forming an insulating layer on the surface and opening prior to forming the pattern of conductors.

20. The method as claimed in claim 18 further comprising forming the package body and interconnect opening in a configuration for packaging the die or for packaging a second die having a different pattern of bond pads.

21. The method as claimed in claim 18 wherein the substrate comprises silicon.

22. The method as claimed in claim 18 further comprising forming the pattern of conductors by a process selected from the group consisting of metallization, screen printing and sputtering.

23. The method as claimed in claim 18 further comprising forming a pattern of metal bumps on the pattern of conductors for mounting the package in electrical contact with contact locations on a supporting substrate.

24. The method as claimed in claim 18 further comprising encapsulating the die on the die mounting location by depositing and curing a material.

25. The method as claimed in claim 18 further comprising mounting and electrically interconnecting a plurality of dice to the package body.

26. The method as claimed in claim 25 wherein the dice and package body comprise a multi-chip-module.

27. The method as claimed in claim 18 further comprising testing the die following packaging using the package body.

28. A method for packaging semiconductor dice comprising:
providing a silicon wafer;
forming a plurality of packages by etching a plurality of die mounting locations into the wafer, etching a plurality of through openings from a surface of the wafer to the die mounting locations, forming an insulating layer on the surface and sidewalls of the openings, forming a plurality of patterns of conductors on the surface, forming a plurality of grooves on the surface, and forming a plurality of patterns of solder balls within the plurality of grooves in electrical communication with the patterns of conductors;
placing the dice circuit side down on the die mounting locations;
singulating the packages from the wafer; and
electrically connecting bond pads on the dice to the conductors on the packages by wire bonding or solder reflowing through the openings.

29. The method as claimed in claim 28 wherein etching the die mounting locations and openings comprises wet etching with an etchant solution.

30. The method as claimed in claim 28 further comprising forming the packages and openings in a configuration for packaging the dice or for packaging different dice having different patterns of bond pads.

31. The method as claimed in claim 28 wherein forming the conductors comprises a process selected from the group consisting of metallization, screen printing and sputtering.

32. The method as claimed in claim 28 further comprising forming a second pattern of grooves in the surface for and forming the pattern of conductors within the second pattern of grooves.

33. The method as claimed in claim 28 wherein the pattern of grooves is formed such that a groove is proximate to a selected edge of each package.

34. The method as claimed in claim 28 further comprising forming wire bonding shelves in the surface for the conductors.

35. The method as claimed in claim 28 further comprising flip chip mounting at least one package to a supporting substrate.

36. A method for packaging a semiconductor die having a pattern of bond pads comprising:
forming a single piece package body with a die mounting location;
forming an interconnect opening through the package body, said opening extending from the die mounting location to a surface of the package body;
forming a pattern of conductors on the surface;
forming a groove on the surface;
forming metal bumps on the groove in electrical communication with the pattern of conductors;
mounting the die circuit side down on the die mounting location with the pattern of bond pads on the die accessible through the interconnect opening; and forming an electrical interconnection through the interconnect opening to the pattern of bond pads on the die and the pattern of conductors on the package body.

37. The method as claimed in claim 36 wherein forming the electrical interconnection comprises wire bonding.

38. The method as claimed in claims 36 wherein forming the electrical interconnection comprises reflowing solder bumps formed on the pattern of bond pads.

39. The method as claimed in claim 36 wherein the package body comprises silicon.

40. The method as claimed in claim 36 wherein the package body comprises an electrically insulating glass filled resin.

41. The method as claimed in claim 36 wherein a plurality of dice are mounted to the die mounting location in electrical communication with the pattern of conductors.

* * * * *